(12) United States Patent
Napetschnig et al.

(10) Patent No.: US 9,484,316 B2
(45) Date of Patent: Nov. 1, 2016

(54) SEMICONDUCTOR DEVICES AND METHODS OF FORMING THEREOF

(71) Applicant: Infineon Technologies AG, Neubiberg (DE)

(72) Inventors: Evelyn Napetschnig, Diex (AT); Ulrike Fastner, Villach (AT); Alexander Heinrich, Regensburg (DE); Thomas Fischer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 76 days.

(21) Appl. No.: 14/070,334

(22) Filed: Nov. 1, 2013

(65) Prior Publication Data

US 2015/0123264 A1    May 7, 2015

(51) Int. Cl.
*H01L 23/00* (2006.01)
*H01L 21/78* (2006.01)
(Continued)

(52) U.S. Cl.
CPC ........... *H01L 24/11* (2013.01); *H01L 21/3086* (2013.01); *H01L 21/6835* (2013.01); *H01L 21/6836* (2013.01); *H01L 21/78* (2013.01); *H01L 24/03* (2013.01); *H01L 24/05* (2013.01); *H01L 24/13* (2013.01); *H01L 24/27* (2013.01); *H01L 24/29* (2013.01); *H01L 24/94* (2013.01); *H01L 2221/6834* (2013.01); *H01L 2221/68327* (2013.01); *H01L 2224/03009* (2013.01); *H01L 2224/0345* (2013.01); *H01L 2224/0361* (2013.01); *H01L 2224/03452* (2013.01); *H01L 2224/03912* (2013.01); *H01L 2224/0401* (2013.01); *H01L 2224/04026* (2013.01); *H01L 2224/0566* (2013.01); *H01L 2224/05082* (2013.01); *H01L 2224/05124* (2013.01); *H01L 2224/05144* (2013.01); *H01L 2224/05155* (2013.01); *H01L 2224/05166* (2013.01); *H01L 2224/05171* (2013.01); *H01L 2224/05172* (2013.01); *H01L 2224/05554* (2013.01);
(Continued)

(58) Field of Classification Search
CPC ......... H01L 24/11; H01L 24/13; H01L 21/78
See application file for complete search history.

(56) References Cited

U.S. PATENT DOCUMENTS 5,596,226 A * 1/1997 Beilstein et al. ............. 257/690
6,103,552 A * 8/2000 Lin .............................. 438/113
(Continued)

FOREIGN PATENT DOCUMENTS

DE    10324615 A1    9/2004
DE    102005010308 A1    9/2006
DE    102009042920 B4    10/2013

OTHER PUBLICATIONS

Lei, W., et al., "Die singulation technologies for advanced packaging: A critical review," Review Article, Applied Materials, American Vacuum Society, Apr. 6, 2012, 27 pages.

*Primary Examiner* — Marc Armand
*Assistant Examiner* — Sarah Salerno
(74) *Attorney, Agent, or Firm* — Slater Matsil, LLP

(57) ABSTRACT

In accordance with an embodiment of the present invention, a method of forming a semiconductor device includes forming a contact layer over a first major surface of a substrate. The substrate includes device regions separated by kerf regions. The contact layer is disposed in the kerf region and the device regions. A structured solder layer is formed over the device regions. The contact layer is exposed at the kerf region after forming the structured solder layer. The contact layer and the substrate in the kerf regions are diced.

25 Claims, 16 Drawing Sheets

(51) Int. Cl.
H01L 21/308 (2006.01)
H01L 21/683 (2006.01)

(52) U.S. Cl.
CPC ............... *H01L2224/05639* (2013.01); *H01L 2224/05644* (2013.01); *H01L 2224/05647* (2013.01); *H01L 2224/05655* (2013.01); *H01L 2224/05657* (2013.01); *H01L 2224/05664* (2013.01); *H01L 2224/05669* (2013.01); *H01L 2224/10126* (2013.01); *H01L 2224/11011* (2013.01); *H01L 2224/11019* (2013.01); *H01L 2224/1134* (2013.01); *H01L 2224/1146* (2013.01); *H01L 2224/1147* (2013.01); *H01L 2224/11845* (2013.01); *H01L 2224/131* (2013.01); *H01L 2224/13007* (2013.01); *H01L 2224/13013* (2013.01); *H01L 2224/13105* (2013.01); *H01L 2224/13109* (2013.01); *H01L 2224/13111* (2013.01); *H01L 2224/13116* (2013.01); *H01L 2224/13118* (2013.01); *H01L 2224/13139* (2013.01); *H01L 2224/13144* (2013.01); *H01L 2224/26125* (2013.01); *H01L 2224/27009* (2013.01); *H01L 2224/27019* (2013.01); *H01L 2224/2746* (2013.01); *H01L 2224/2747* (2013.01); *H01L 2224/27845* (2013.01); *H01L 2224/291* (2013.01); *H01L 2224/29007* (2013.01); *H01L 2224/29013* (2013.01); *H01L 2224/29105* (2013.01); *H01L 2224/29109* (2013.01); *H01L 2224/29111* (2013.01); *H01L 2224/29116* (2013.01); *H01L 2224/29118* (2013.01); *H01L 2224/29139* (2013.01); *H01L 2224/29144* (2013.01); *H01L 2224/94* (2013.01); *H01L 2924/014* (2013.01); *H01L 2924/0105* (2013.01); *H01L 2924/01013* (2013.01); *H01L 2924/01024* (2013.01); *H01L 2924/01028* (2013.01); *H01L 2924/01029* (2013.01); *H01L 2924/01047* (2013.01); *H01L 2924/01049* (2013.01); *H01L 2924/01079* (2013.01); *H01L 2924/12042* (2013.01); *H01L 2924/181* (2013.01)

(56) References Cited

U.S. PATENT DOCUMENTS

| | | | |
|---|---|---|---|
| 6,960,826 B2 | 11/2005 | Ho et al. | |
| 7,989,319 B2* | 8/2011 | Grivna et al. | 438/462 |
| 2004/0017012 A1* | 1/2004 | Yamada | H01L 21/76898 257/774 |
| 2007/0235744 A1* | 10/2007 | Tran | H01L 21/2007 257/94 |
| 2009/0045511 A1* | 2/2009 | Meyer et al. | 257/738 |
| 2012/0282767 A1* | 11/2012 | Jin et al. | 438/613 |
| 2013/0069080 A1* | 3/2013 | Sugiyama | 257/77 |
| 2013/0134581 A1* | 5/2013 | Lin | H01L 21/563 257/737 |

\* cited by examiner

Fig. 10

| | Contact Layer | Solder Layer |
|---|---|---|
| 1 | Al/Ti/Cu/ | Sn/AG |
| 2 | Al/Ti/Cu/ | An/Au |
| 3 | Ti/Cu | Sn/Au |
| 4 | Ti/Cu | Sn/Ag |
| 6 | Al/Ti/Ag | Sn/Au |
| 7 | Al/Ti/Ag | Sn/Ag |
| 8 | Ti/Ni | Sn/Au |
| 9 | Ti/Ni | Sn/Ag |
| 10 | Al/Ti/Ni | Sn/Au |
| 11 | Al/Ti/Ni | Sn/Ag |
| 12 | Al/Ti/Cu | In/Au |
| 13 | Al/Ti/Cu | In/Ag |
| 14 | Al/Ti/Cu | InSn/Au |
| 15 | Al/Ti/Cu | InSn/Ag |
| 16 | Al/Ti/Ni | InSn/Au |
| 17 | Al/Ti/Ni | InSn/Ag |
| 18 | Al/Ti/Ag | InSn/Au |
| 19 | Al/Ti/Ag | InSn/Ag |
| 20 | Al/Ti/NiV/Ag | Cu/Sn/Ag |
| 21 | Ti/NiV/Ag/Cu | Sn/Ag |
| 22 | Al/Ti/NiV/Ag | Cu/Sn/Au |
| 23 | Ti/NiV/Ag/Cu | Sn/Au |

SEMICONDUCTOR DEVICES AND METHODS OF FORMING THEREOF

TECHNICAL FIELD

The present invention relates generally to semiconductor devices, and, in particular embodiments, to a semiconductor devices and methods of forming thereof.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of materials over the semiconductor wafers, patterning the thin films of material, doping selective regions of the semiconductor wafers, and other processes.

In a conventional semiconductor fabrication process, a large number of semiconductor devices are fabricated within and/or over a single wafer. After completion of device level and interconnect level fabrication processes, the semiconductor devices within the wafer are separated. For example, the wafer may undergo singulation. During singulation, the wafer is treated, e.g., mechanically, and the semiconductor devices are physically separated to form individual dies. Purely mechanical separation is not space efficient compared to chemical processes. However, chemical separation of small sized dies requires overcoming many difficult process issues.

SUMMARY OF THE INVENTION

In accordance with an embodiment of the present invention, a method of forming a semiconductor device comprises forming a contact layer over a first major surface of a substrate. The substrate comprises device regions separated by kerf regions. The contact layer is disposed in the kerf region and the device regions. A structured solder layer is formed over the device regions. The contact layer is exposed at the kerf region after forming the structured solder layer. The contact layer and the substrate in the kerf regions are diced.

In accordance with an alternative embodiment of the present invention, a method of forming a semiconductor device comprises forming a contact layer over a first major surface of a substrate, forming a structured solder layer over the contact layer, and singulating the substrate by dicing through the contact layer and the substrate and not the structured solder layer.

In accordance with an alternative embodiment of the present invention, a semiconductor device comprises a contact layer disposed over a major surface of a substrate. A solder pad is disposed over the contact layer. The solder pad overlaps with a central portion of the contact layer. A remaining peripheral portion of the contact layer comprises a surface parallel to the major surface of the substrate and is part of an exposed surface of the semiconductor device.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1A-1C, illustrates a semiconductor device in accordance with an embodiment of the present invention, wherein FIG. 1A illustrates a cross-sectional view, wherein FIG. 1B illustrates a bottom view, and wherein FIG. 1C illustrates a top view;

FIG. 2, which includes

FIG. 3, which includes

FIG. 4, which includes

FIG. 5, which includes

FIG. 6, which includes

FIG. 7, which includes

FIG. 8, which includes

FIG. 9, which includes FIG. 10 illustrates a table comprising the metal layer stack used for the contact layer and the solder layer in accordance with embodiments of the present invention.

DETAILED DESCRIPTION OF ILLUSTRATIVE EMBODIMENTS

Modern wafer dicing methods such as plasma dicing, laser dicing offer a much better performance in terms of quality and cost. Thus, the implementation of these methods is a trend in semiconductor manufacturing. However, the use of a back side solder metal which is deposited onto the wafer backside before dicing is a blocking point for using such modern dicing methods. This is because, owing to the large thickness of the back side solder metal, the dicing of the back side solder metal may result in chipping, die cracks, and other defects. For example, the dicing of back side metal layers thicker than 1 µm results in an unacceptable increase in defectivity. Embodiments of the present invention overcome these and other problems. Accordingly, embodiments of the invention enable the usage of standard chip separation techniques.

A structural embodiment of the present invention will be described using FIG. 1. Alternative structural embodiments will be described using FIGS. 3E, 4D, 5C, 6B, 7D, 8C, 8D, and 9. An embodiment of a method of forming the device will be described using FIG. 2. Alternative embodiments of the manufacturing the semiconductor device will be described using FIGS. 3-8.

Figure 1A:
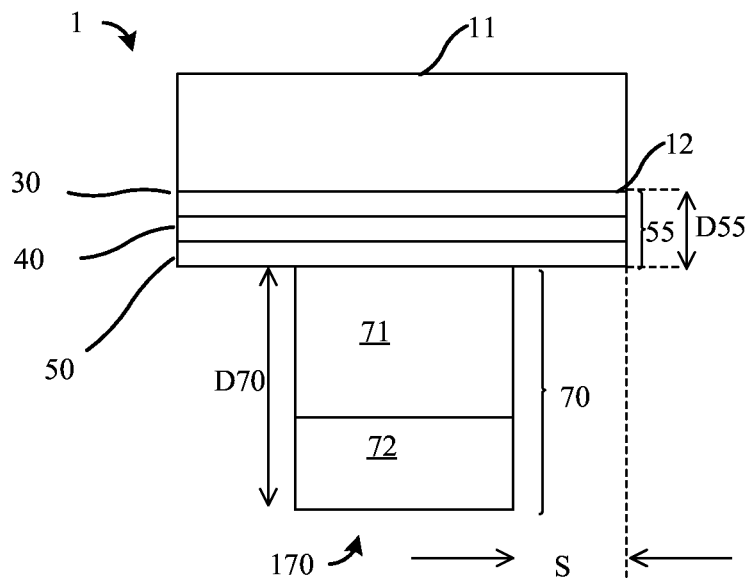
Figure 1B:
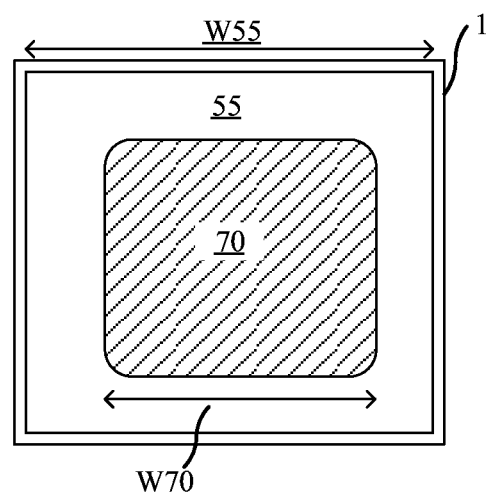
Figure 1C:
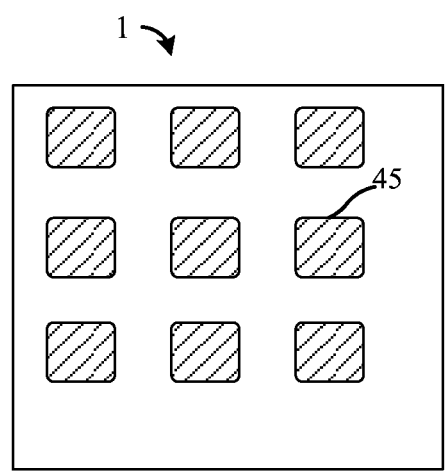

FIG. 1, which includes FIGS. 1A and 1B, illustrates a semiconductor device in accordance with an embodiment of the present invention, wherein FIG. 1A illustrates a cross-sectional view, wherein FIG. 1B illustrates a bottom view, and wherein FIG. 1C illustrates a top view.

Referring to FIG. 1A, the semiconductor device includes a chip 1, which may include active devices. For example, in one embodiment, the chip 1 may include one or more semiconductor devices such as transistors, diodes, thyristors, and others. In one or more embodiments, the various devices in the chip 1 may be interconnected through metallization layers at a top surface 11 of the chip 1.

In various embodiments, the chip 1 may be formed in a semiconductor substrate, for example, comprising silicon. In one or more embodiments, the chip 1 may include various epitaxial layers including hetero epitaxial layers. For example, in one or more embodiments, one or more hetero epitaxial layers comprising a compound semiconductor may be formed over a semiconductor substrate.

In various embodiments, the back side metallization layer may be deposited over the back surface 12 of the chip 1. The back side metallization layer includes a contact layer 55 and a solder layer 70. The contact layer 55 may include a first contact layer 30, which may be a layer to improve the contact resistance with the chip 1. The contact layer 55 may further include a second contact layer 40 which may be a barrier layer for the overlying metal layers. Additionally, the contact layer 55 may also include a third contact layer 50 which may be a reaction or seed layer for a subsequent plating process. In some embodiments, the contact layer 55 may further include a fourth contact layer.

In one or more embodiments, the first contact layer 30 may comprise aluminum, titanium, and other such metals. In another embodiment, the first contact layer 30 may comprise Al, Ti, Cr, gold, or alloys of these and may include other alloying elements.

In various embodiments, the second contact layer 40 may comprise titanium, copper, nickel, nickel vanadium, and other such metals. In one or more embodiments, the second contact layer 40 may comprise Ti, W, or alloys of these including other alloying elements.

In one or more embodiments, the third contact layer 50 may comprise copper, nickel, silver, nickel vanadium, and other such metals. In a further embodiment, the third contact layer 50 may comprise Cu, Ni, Ag, Pt, Au, Fe, Co, Pd or alloys of these including other alloying elements or any suitable metal, metal alloy forming an interconnect with the solder layer 70.

Referring again to FIG. 1A, the solder layer 70 may include one or more layers in various embodiments. The patterned solder layer 70 forms a solder pad 170, which may be used to solder the chip 1 to an external contact. In one embodiment, the solder layer 70 includes a solder metal layer 71 and a solder protection layer 72. In various embodiments the solder metal layer 71 may comprise a tin, indium, indium tin, and other such metals. In one or more embodiments, the solder metal layer 71 may comprise Sn, Zn, In, Ga, Ge, Pb or alloys of these including other alloying elements like AuSn, CuSnAg, SnAg, or any suitable metal, metal alloy or solder material melting in the desired temperature range.

The solder protection layer 72 may comprise silver, gold, and other such metals in various embodiments. In one or more embodiments, the solder protection layer 72 may comprise Au, Ag, Pt, Pd or alloys of these including other alloying elements or any element, alloy or compound, which, e.g., may be appropriate to prevent oxidation of the underlying solder metal layer 71.

As illustrated in FIG. 1A, the contact layer 55 has a first thickness D55 while the solder layer 70 has a second thickness D70. In various embodiments, the thickness of the contact layer 55 is much less than the thickness of the solder layer 70. In one or more embodiments, the ratio of the first thickness D55 to the second thickness D70 is at least 1:5, and varies from 1:3 to about 1:100 in various embodiments.

In one or more embodiments, the first thickness D55 is about 100 nanometers or less, while the second thickness D70 is about 1 µm or more.

In various embodiments, the contact layer 55 has a first width W55 while the solder layer 70 has a second width W70. In various embodiments, the width of the contact layer 55 is much less than the width of the solder layer 70. In one or more embodiments, the ratio of the first width W55 to the second width W70 is at least 1:1.3, and varies from 1:1 to about 1:2 in various embodiments. Consequently, a step S (FIG. 1A) is formed in which at least a portion of the contact layer 55 is exposed, i.e., not covered by the solder layer 70.

In various embodiments, the solder pad 170 overlaps with at least 80% of the entire surface of the contact layer 55. In one embodiment, the solder pad 170 overlaps with at least 90% of the entire surface of the contact layer 55. In a further embodiment, the solder pad 170 overlaps with at least 95% of the entire surface of the contact layer 55.

In various embodiments, the contact layer 55 and the solder layer 70 may comprise a stack of metals such as the stack listed in Table 1 (FIG. 10).

FIG. 1C illustrates the top view of the chip 1 illustrating a plurality of contact regions 45 at the front side of the device opposite the back side with the solder layer 70 in accordance with one or more embodiments of the present invention. The plurality of contact regions 45 may couple to various device regions within the chip 1 through front side metallization layers. In one embodiment, one of the plurality of contact regions 45 may be coupled to one or more gate regions of a transistor while the other plurality of contact regions 45 may be coupled to source regions of the transistor.

FIG. 2, which includes FIGS. 2A-2G, illustrates a cross-sectional view of a semiconductor device during various stages of fabrication in accordance with an embodiment of the present invention.

Figure 2A:
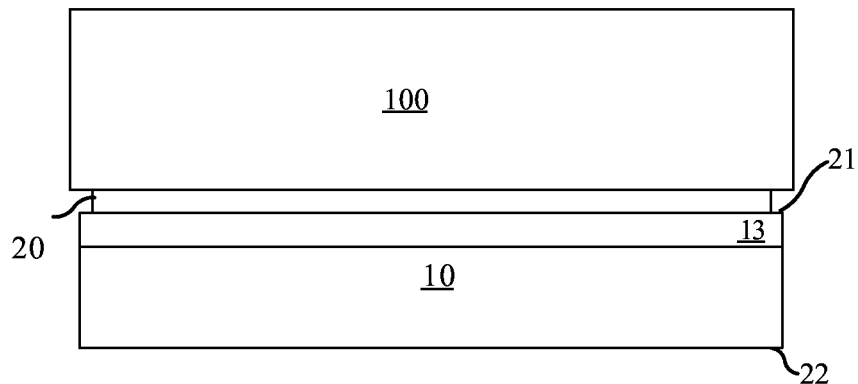
FIGS. 2A-2G, illustrates a cross-sectional view of a semiconductor device during various stages of fabrication in accordance with an embodiment of the present invention.

Referring to FIG. 2A, a substrate 10 is mounted onto a carrier wafer 100 using a mounting layer 20. In various embodiments, the substrate 10 may be silicon alloys and compound semiconductors. The substrate 10 may be a wafer and may include epitaxial layers in various embodiments. In one or more embodiments, the substrate 10 may be a bulk silicon wafer or a silicon-on-insulator wafer. In some embodiments, the substrate 10 may be an III-V substrate with elements from Group III and Group V, or the substrate 10 may be an II-VI substrate with elements from Group II and Group VI. In one or more embodiments, the substrate 10 may be a silicon-on-sapphire (SOS) substrate. In one or more embodiments, the substrate 10 may be a germanium-on-insulator (GeOI) substrate. In one or more embodiments, the substrate 10 may include one or more semiconductor materials such as silicon, silicon germanium, silicon carbon, germanium, gallium arsenide, indium arsenide, indium arsenide, gallium nitride, indium gallium arsenide, or indium antimonide.

At this stage of processing, the substrate 10 may have completed front stage processing. The substrate 10 comprises a top surface 21 and an opposite back surface 22. For example, the device regions and front side metallization layers may be formed at the top surface 21 of the substrate 10. The substrate 10 may include a plurality of dies, which may comprise different type of dies including integrated circuits or discrete devices. In one or more embodiments, the plurality of dies in the substrate 10 may comprise logic chips, memory chips, analog chips, mixed signal chips, and combinations thereof such as system on chip. The plurality of dies in the substrate 10 may comprise various types of active and passive devices such as diodes, transistors, thyristors, capacitors, inductors, resistors, optoelectronic devices, sensors, microelectromechanical systems, and others. In one embodiment, the substrate 10 comprises a plurality of dies, each die being a discrete device such as a single transistor. Examples of discrete devices include power devices, vertical devices (current flowing from top to bottom), and others.

The carrier wafer 100 may not be part of the fabricated product, and rather may be used to support the substrate 10 during the fabrication process. In FIG. 2A, the top surface 21 of the substrate 10 is attached to the carrier wafer 100, and therefore contacts the mounting layer 20. In various embodiments, the mounting layer 20 is configured to minimize any damage to the front side of the substrate 10. In one or more embodiments, the carrier wafer 100 may be a glass carrier. The mounting layer 20 may comprise an adhesive material such as a nano-paste in various embodiments. Additionally, the carrier wafer 100 may also stabilize the substrate 10 during the thinning process and prevent the wafer breakage.

In various embodiments, the active devices are formed closer to the top surface 21 of the substrate 10 than the back surface 22. The active devices are formed in the device regions 23 of the substrate 10. The depth of the device regions 23 may depend on the type of device, and may be about 50 µm to about 500 µm, and about 200 µm in one embodiment. Further, a final depth of the plurality of dies will be determined after substrate thinning as will be described subsequently.

Figure 2B:
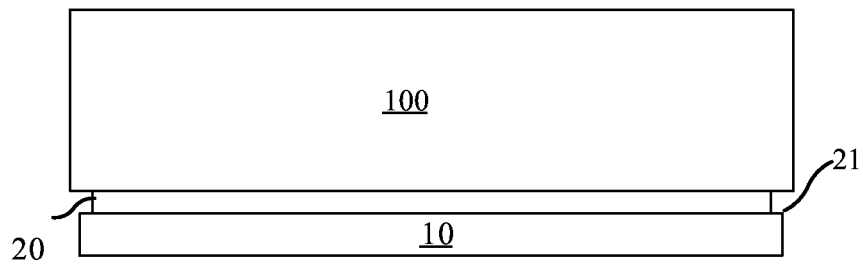

Referring to FIG. 2B, the substrate 10 is thinned to the desired final thickness. The thinning may be performed using a chemical, mechanical, and/or a combination of both in various embodiments. In various embodiments, the thickness of the substrate 10 may be reduced to less than 100 µm, and less than about 10 µm in one embodiment. In one embodiment, the thinning process may be a combination of grinding and different types of etching, e.g., a smooth damage etch process and a rough damage etch process. In rough damage etch, different etch chemistry may be selected depending on the substrate material and doping. In contrast, in smooth damage etch process, the chemistry of the etching process is independent of the substrate material and doping.

Figure 2C:
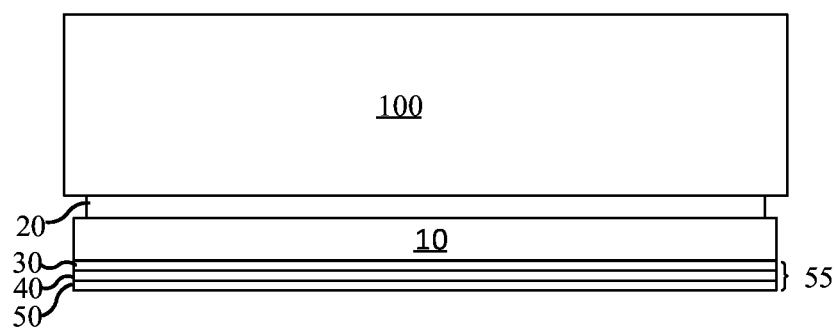

Referring next to FIG. 2C, the contact layer 55 is formed over the back side of the substrate 10. Prior to forming the contact layer 55, the back surface 22 of the substrate 10 may be prepared to improve contact, i.e., reduce contact resistance to the contact layer 55. In various embodiments, any native oxide and/or protective oxide on the back surface 22 may be removed using an etch process, for example. In one or more embodiments, the back surface 22 may be subjected to an ion implantation process to enable the formation of smooth surface.

As illustrated in FIG. 2C, the contact layer 55 may be deposited as a blanket layer over the back surface 22 in one or more embodiments. In various embodiments, the contact layer 55 may include one or more conductive layers. As an example, the contact layer 55 includes a first contact layer 30, a second contact layer 40, and a third contact layer 50.

In various embodiments, the contact layer 55 may be deposited using a physical vapor deposition, chemical vapor deposition, other vapor deposition, sputtering, atomic layer deposition, and other processes. In one or more embodiments, the different layers within the contact layer 55 may be deposited within the same process tool, or using different process tools.

In various embodiments, the contact layer 55 may have a thickness that is less than a few hundred nanometers. In one embodiment, the first contact layer 30 may be a layer comprising aluminum, the second contact layer 40 may be a layer, while the third contact layer 50 may be layer. In one or more embodiments, the layer comprising titanium may help form a diffusion barrier for the third contact layer 50 as well as the subsequent solder layer 70, which is discussed in FIG. 2E. Further, the leader comprising copper may be a seed layer for the subsequent plating process used to form the solder layer 70.

Figure 2D:
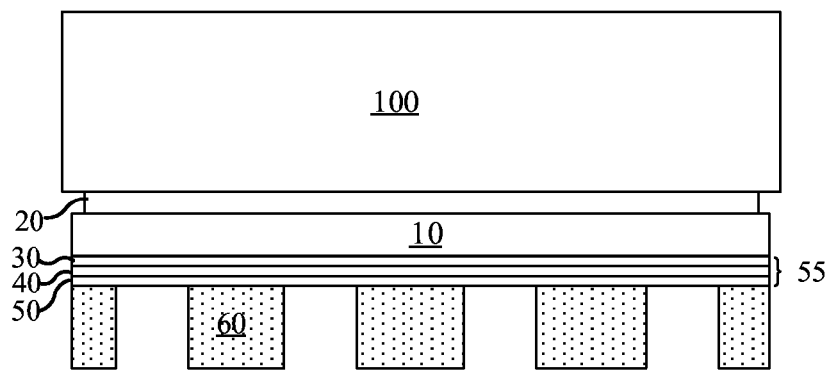

As next illustrated in FIG. 2D, a first resist layer 60 is deposited and patterned. In one or more embodiments, the first resist layer 60 may be patterned using a lithography process. Alternatively, in some embodiments, the first resist layer 60 may be deposited using a printing technique. The patterning of the first resist layer 60 may be aligned to the front side of the substrate 10 in various ways. In one embodiment, an infrared alignment may be used in which the infrared light transmitting through the substrate 10 may be used. Alternatively, in another embodiment, the patterning may be directly aligned to the features of the front side, for example, using a capable exposure tool mask aligner and a back side alignment tool.

In various embodiments, the first resist layer 60 may be a photoresist. Alternatively, in one or more embodiments, the material of the first resist layer 60 may be different from the photoresist used to pattern the first resist layer 60. For example, this may provide flexibility in selecting an appropriate material for the first resist layer 60. In such an instance, the photoresist used to pattern the first resist layer 60 is removed after patterning the first resist layer 60, for example, using a plasma ashing process. Alternatively, a descum process may be used to remove any residual resist material in the trenches between the patterned first resist layer 60.

Figure 2E:
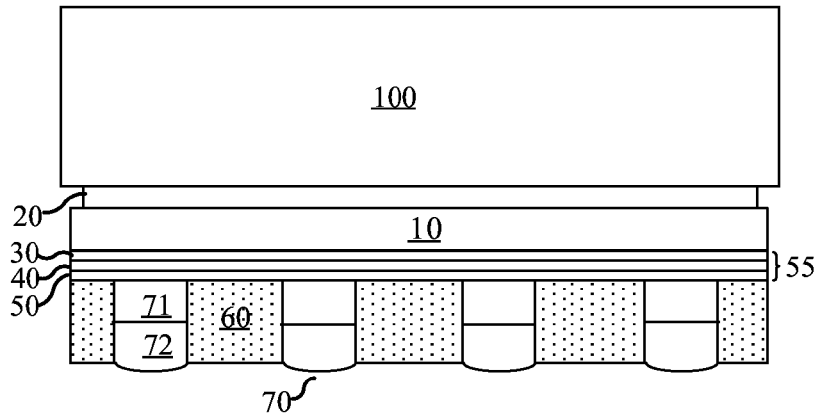

As next illustrated in FIG. 2E, a solder layer 70 is plated within the trenches between the patterned first resist layer 60. The solder layer 70 may be deposited using an electrochemical deposition process or using an electroless plating process in one or more embodiments. In various embodiments, the different layers of the solder layer 70 may be plated using different plating chemistries and/or plating steps.

In various embodiments, the solder layer 70 may comprise more than one metal layer. In the illustration, a solder metal layer 71 is first deposited over which of solder protection layer 72 is formed.

In various embodiments, the first resist layer 60 is selected such that the first resist layer 60 is immune to the chemistry of the pattern plating process. For example, electrochemical deposition may be performed using a solvent having a high acidity or base, which may etch the first resist layer 60. However, etching of the first resist layer 60 during the pattern plating process will result in the formation of the solder layer 70 in regions other than the trenches between the patterned first resist layer 60.

In various embodiments, the first resist layer 60 is resistant to the plating bath of the pattern plating process and therefore also blocks the plating of the solder metal in the kerf areas.

Figure 2F:
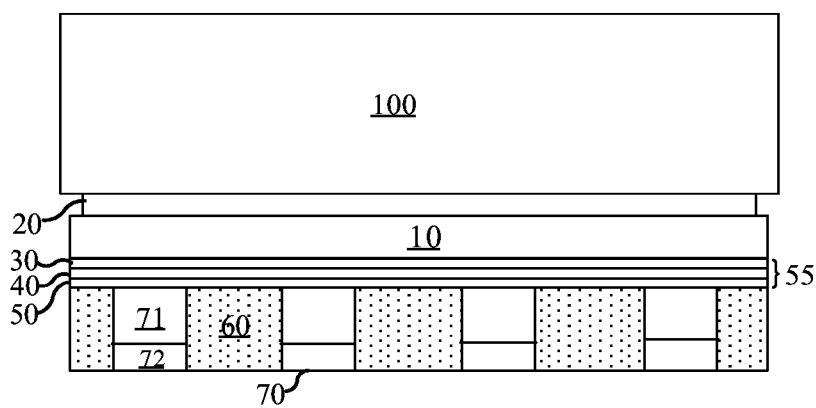

Referring to FIG. 2F, in some embodiments, the surface of the solder layer 70 may be planarized so as to form a planar surface, for example, which is coplanar with the first resist layer 60. In one or more embodiments, the solder layer 70 may be planarized using a chemical mechanical polishing process.

Figure 2G:
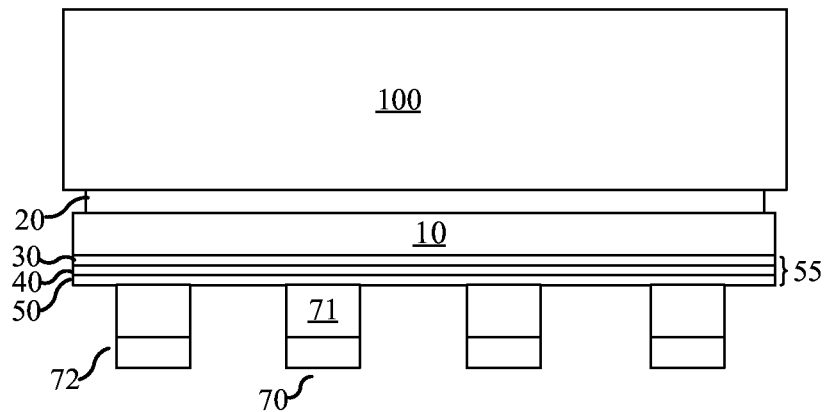

As next illustrated in FIG. 2G, the first resist layer 60 is removed. In one or more embodiments, the first resist layer 60 is removed using a wet etching process. However, in other embodiments, other types of processes may be used to remove the first resist layer 60.

Advantageously, in various embodiments, the chemistry of the first resist layer 60 is carefully selected such that the first resist layer 60 may be removed without significantly removing the solder layer 70. Further, in some embodiments, the first resist layer 60 may be selectively removed with respect to the contact layer 55 as well.

In an alternative embodiment, the process steps illustrated in FIGS. 2D-2F may be skipped and the solder layer 70 may be printed directly onto the contact layer 55 to form the structure illustrated in FIG. 2G.

Subsequent processing, which includes dicing the substrate 10, may continue as described further in various embodiments of FIGS. 3-7.

FIG. 3, which includes FIGS. 3A-3E, illustrates a semiconductor device in various stages of fabrication for singulating the substrate in accordance with an embodiment of the present invention.

In this embodiment, the substrate 10 is singulated using a plasma dicing process. Advantageously, the plasma dicing process has to cut through a thin contact layer 55 rather than the thick solder layer 70.

Figure 3A:
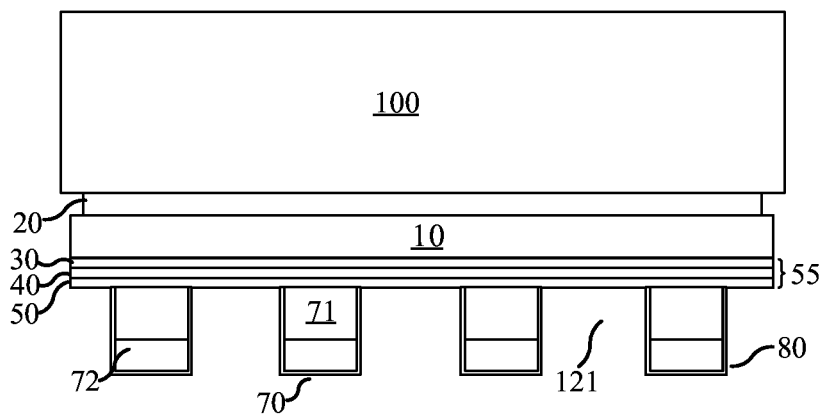
FIGS. 3A-3E, illustrates a semiconductor device in various stages of fabrication for singulating the substrate in accordance with an embodiment of the present invention.

The semiconductor device illustrated in FIG. 3A follows from the process described previously in FIG. 2G. Referring to FIG. 3A, in one or more embodiments, a second resist layer 80 is formed over the solder layer 70. The second resist layer 80 is selected to protect the underlying solder layer 70 during subsequent etching of the contact layer 55. In one embodiment of the present invention, the first resist layer 60 previously used was a negative photo resist while the second resist layer 80 is a positive photo resist. Therefore, the second resist layer 80 may be patterned using conventional lithography techniques. The kerf areas 121 are not covered with the second resist layer 80 after the formation of the second resist layer 80. In various embodiments, the second resist layer 80 is thick enough to cover the topography of the structured solder layer 70.

Figure 3B:
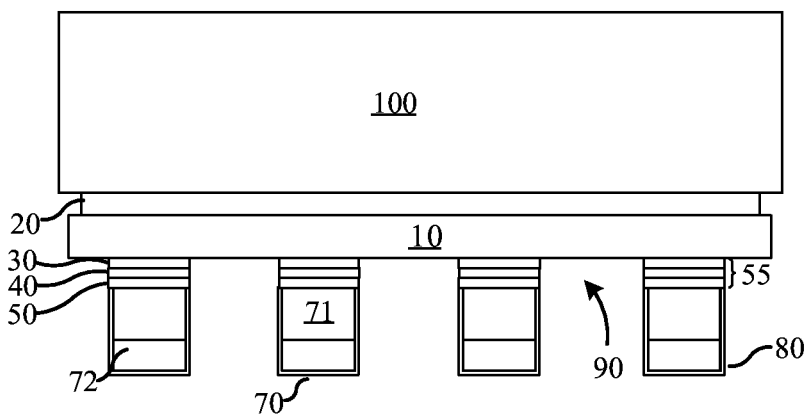

Referring to FIG. 3B, the substrate 10 with the contact layer 55 is exposed to an etching process. The solder layer 70 is covered by the second resist layer 80 and is therefore not removed or etched by the etching process. The etching process may be a wet etching process in one embodiment. In another embodiment, the etching process may be a dry etching process. In some embodiments, the contact layer 55 may be etched using a plasma etching process. The removal of the contact layer 55 results in the formation of the first trenches 90. After the etching process, the surface of the substrate 10 is exposed under the first trenches 90.

Figure 3C:
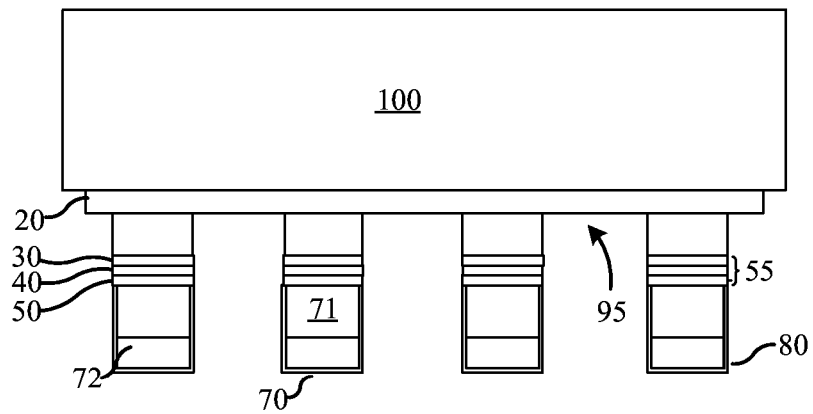
Figure 3D:
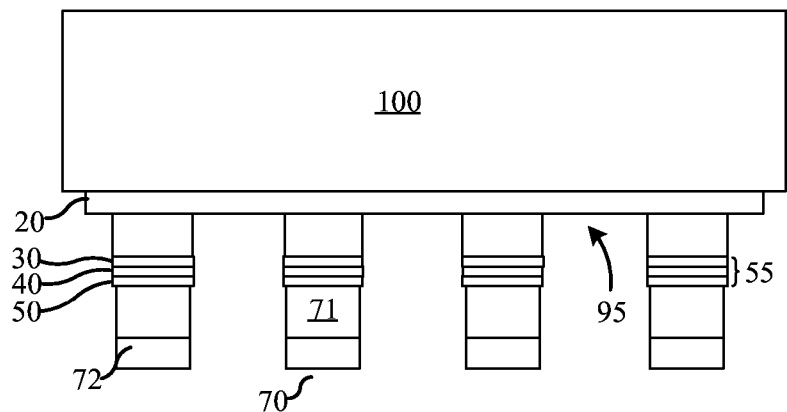

As next illustrated in FIG. 3C, the exposed substrate 10 is etched. In various embodiments, the substrate 10 is removed using a plasma dicing process. In one or more embodiments, a deep reactive ion etching process may be used for the plasma dicing process. In one embodiment, the plasma etching process may be performed using an etchant such as sulfur hexafluoride ($SF_6$). In some embodiments, the plasma dicing process may be performed in combination with a passivation process, e.g., using octa-fluoro-cyclobutane as a source gas. In various embodiments, the plasma dicing process simultaneously singulates the substrate 10 at all the kerf area 121.

In alternative embodiments, other dicing techniques such as dry laser dicing and stealth laser dicing, and/or mechanical dicing may also be used singly or in combination with plasma dicing.

After the plasma dicing process, the second resist layer 80 and any polymer residue resulting from the plasma dicing process is removed. For example, a wet etching process may be used to remove the second resist layer 80 and the polymer residues in one embodiment.

Figure 3E:
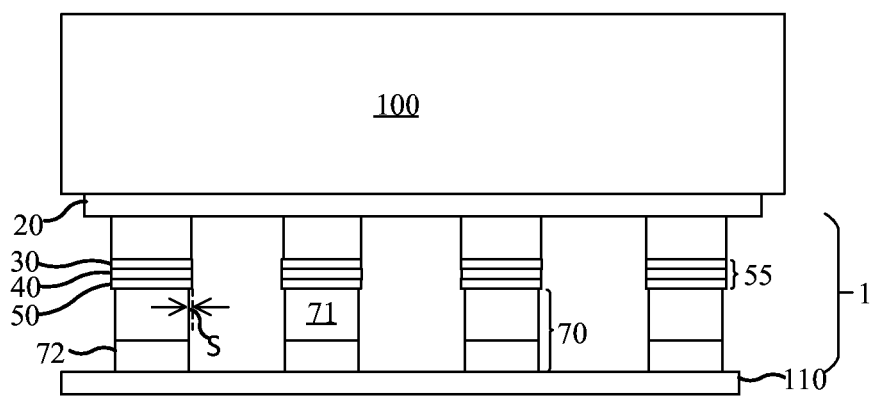

Referring to FIG. 3E, the singulated chips, which are supported on the carrier wafer 100, are mounted onto an adhesive foil 110. The carrier wafer 100 and the mounting layer 20 are removed from the separated chips 1.

Subsequent processing may continue according to conventional processing. Accordingly, in some embodiments, the separated dies may be compiled as bulk and then processed through a bowl feeder. A die attach process may be performed subsequently if the die are to be packaged on substrates such as a lead frames.

FIG. 4, which includes FIGS. 4A-4D, illustrates a semiconductor device singulated using an alternative embodiment of the present invention.

Unlike the prior embodiment, in this embodiment, the substrate 10 may be singulated using a mechanical dicing, dry laser process, or a stealth dicing process.

This embodiment may also follow the processing steps described in FIG. 2. Subsequently, referring to FIG. 4A, the substrate 10 is mounted on an adhesive foil 110 after the first resist layer 60 is removed as described in FIG. 2G.

Figure 4A:
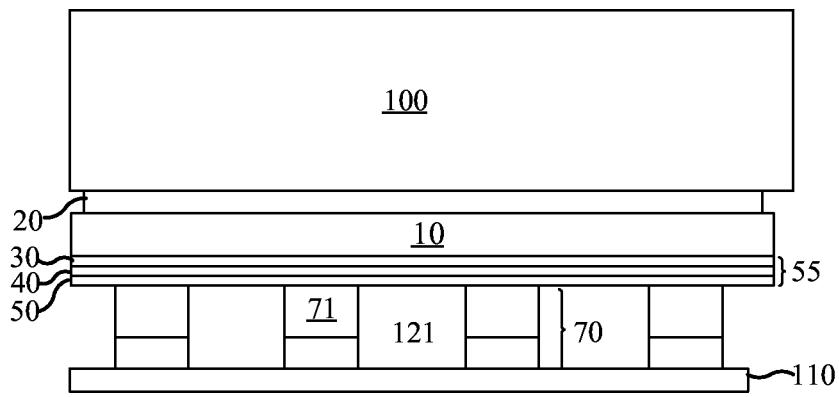
FIGS. 4A-4D, illustrates a semiconductor device singulated using an alternative embodiment of the present invention.
Figure 4B:
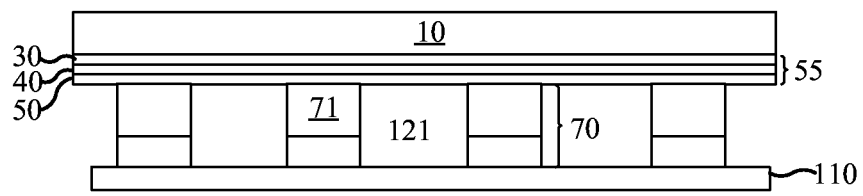
Figure 4C:
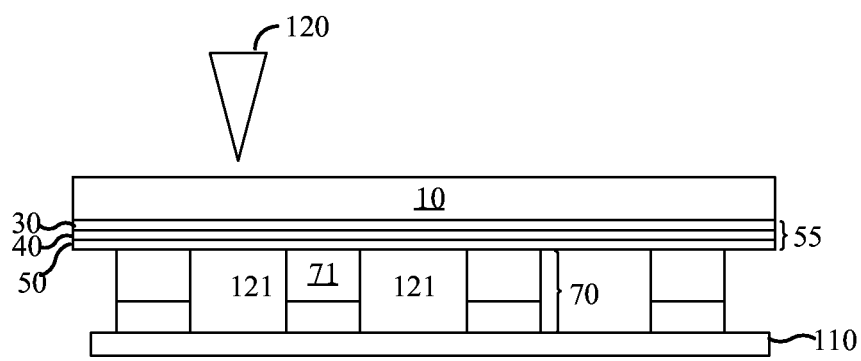

Referring to FIG. 4B, the carrier wafer 100 is removed from the substrate 10 after mounting the substrate 10 onto the adhesive foil 110. Alternatively, in one embodiment, the dicing may be performed using a mechanical dicing process. This is because, the solder layer 70 is not formed over the entire substrate 10 and in particular in the kerf area 121. Therefore, the dicing process has to only cut through the contact layer 55, which is much thinner than the solder layer 70. As a consequence, any conventional dicing process may be used to singulate the substrate 10. As an example, a dicing blade 120 is illustrated in FIG. 4C.

Advantageously, in various embodiments, a laser process may be used to singulate the substrate 10 because of the absence of the solder layer 70. If the solder layer 70 were present in the kerf area 121 (without using an embodiment of the present invention), the high temperatures associated with the laser process may result in the inter mixing of the material of the solder layer 70. In various embodiments, a laser dicing process may proceed using a dry laser process, a stealth laser process, or a combination thereof. In a stealth dicing process, a laser beam of a wavelength capable of transmitting through the substrate 10 is focused onto a point inside the substrate 10. Due to a non-linear absorption effect, only localized points inside the substrate 10 may be selectively laser-machined so as to avoid damaging the front and back surface of the substrate 10. The substrate 10 may be diced by moving the relative positions of the laser beam and the substrate 10 in order to scan the substrate 10 according to the desired dicing pattern.

Figure 4D:
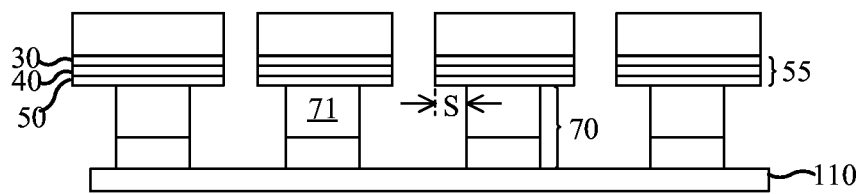

FIG. 4D illustrates the semiconductor device on the adhesive foil 110 after the singulation process. Subsequent processing may follow conventional processing.

Figure 5A:
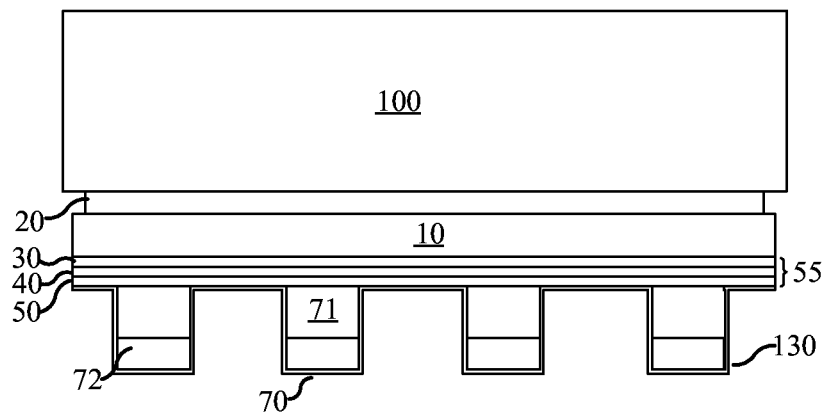
FIGS. 5A-5C, illustrates a semiconductor device during various stages of fabrication in accordance with an alternative embodiment of the present invention.
Figure 5B:
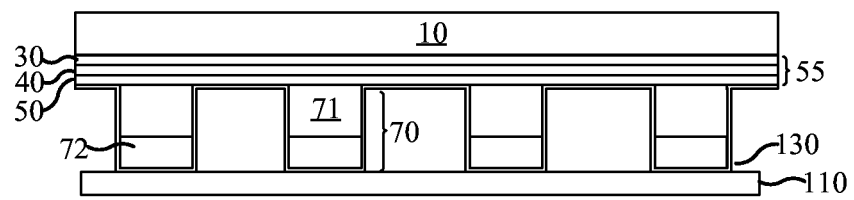
Figure 5C:
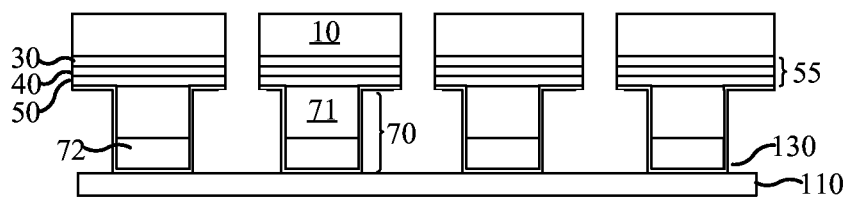

FIG. 5, which includes FIGS. 5A-5C, illustrates a semiconductor device during various stages of fabrication in accordance with an alternative embodiment of the present invention.

In this embodiment, an additional protective layer is formed over the solder layer 70. This embodiment also proceeds from the embodiment described in FIG. 2 and follows the process of FIG. 2G. In some embodiments, prior to the dicing processes, an additional protective layer 130 may be deposited. The additional protective layer 130 may be deposited over the contact layer 55 and the solder layer 70 in a conformal way in one or more embodiments. In some embodiments, the additional protective layer 130 may be formed as a liner as illustrated in FIG. 5B, or as a spacer (for example see FIG. 9B). If a spacer is to be formed, an additional anisotropic etch may be performed to remove the additional protective layer 130 from over the contact layer 55. Subsequent processing may follow one of the previously discussed embodiments, for example, mounting on an adhesive foil 110 (FIG. 5B) and singulating the substrate 10 to form the chips (FIG. 5C).

Figure 6A:
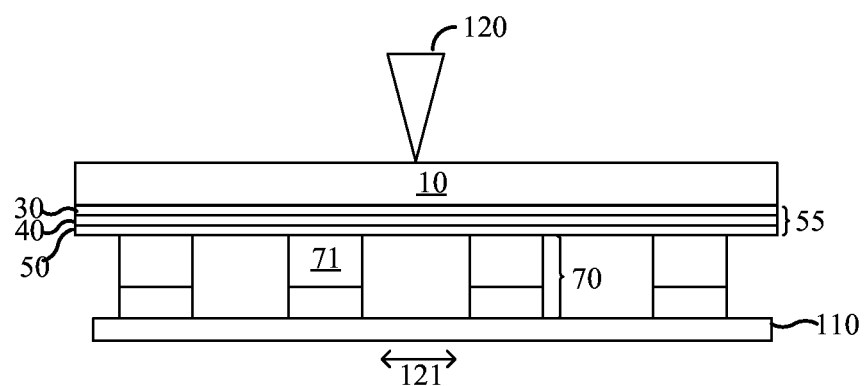
FIGS. 6A and 6B, illustrates an alternative embodiment of the present invention in which each chip includes more than one back side metallization contact.
Figure 6B:
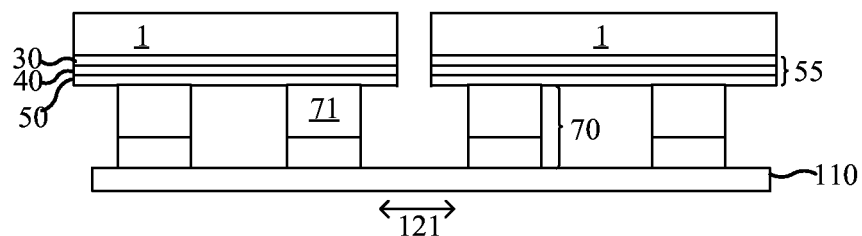

FIG. 6, which includes FIGS. 6A and 6B, illustrates an alternative embodiment of the present invention in which each chip includes more than one back side metallization contact. Referring to FIG. 6A, the various embodiments of the present invention may be applied to form multiple patterns of the solder layer 70 between each adjacent kerf area 121. In various embodiments, the patterned solder layer 70 may be electrically coupled through the contact layer 55. Accordingly, as illustrated in FIG. 6B, after the singulation, each chip 1 comprises more than one patterned solder layer 70.

FIG. 7, which includes FIGS. 7A-7D, illustrates an alternative embodiment of the present invention in which each chip includes more than one back side metallization contact.

Unlike the embodiment illustrated in FIG. 6, in this embodiment, the adjacent solder contact structures formed from the solder layer 70 are not electrically coupled through the contact layer 55. Hence, this embodiment may be used to couple different device regions of the substrate 10.

Figure 7A:
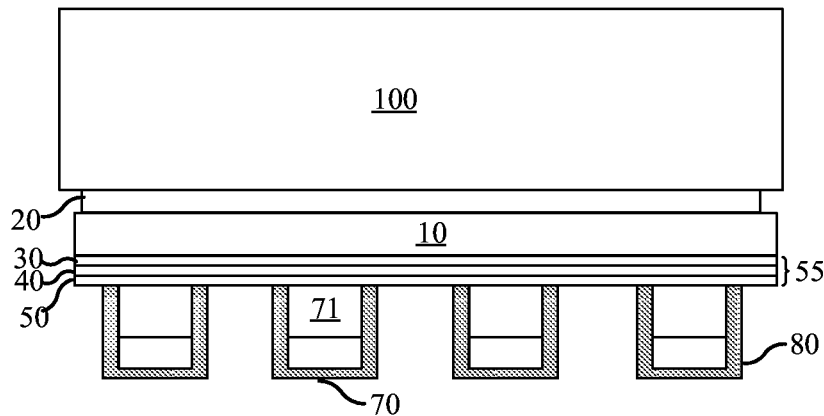
FIGS. 7A-7D, illustrates an alternative embodiment of the present invention in which each chip includes more than one back side metallization contact.
Figure 7B:
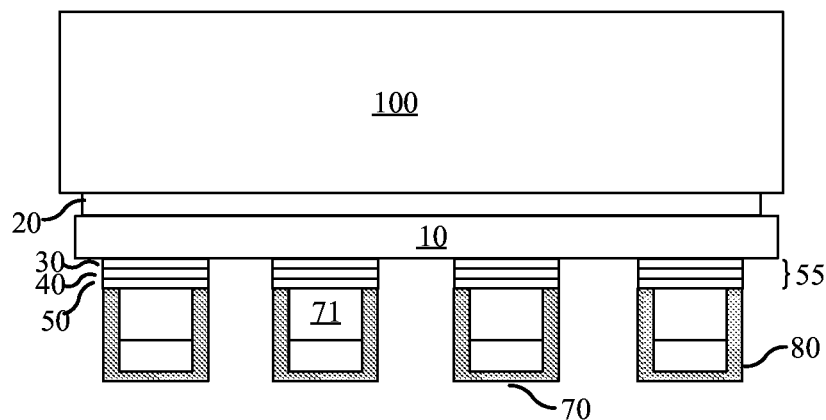

Referring to FIG. 7A, the semiconductor device is illustrated after forming the second layer 80 as in FIG. 3A. As also illustrated in FIG. 7B, the exposed contact layer 55 is removed using the second resist layer 80 as a mask during the etching of the exposed contact layer 55. In other words, the second resist layer 80 protects the underlying solder layer 70 during the etching of the contact layer 55.

Figure 7C:
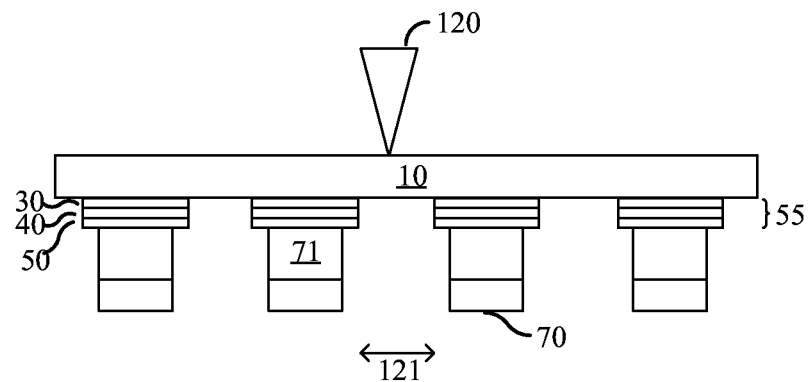
Figure 7D:
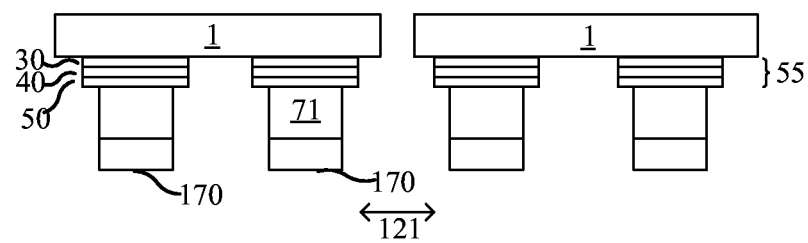

Referring to FIG. 7C, the singulation may be performed using a mechanical dicing process in one embodiment. As an illustration, a dicing blade 120 is used in the kerf area 121 to singulate the substrate 10. Alternatively, in another embodiment, a plasma dicing process may be performed, for example, by using the process steps described in FIGS. 3A and 3C, i.e., by depositing and patterning another photo resist so as to expose only the kerf area 121 to the plasma dicing process. As a consequence, a chip 1 comprising multiple solder pads 170 that are not electrically coupled is formed (FIG. 7D).

FIG. 8, which includes FIGS. 8A-8D, illustrates a wafer level package during various stages of fabrication in accordance with alternative embodiments of the present invention.

Embodiments of the present invention may also be applied to other types of substrates. As an illustration, the embodiments of the present invention described in FIGS. 1-7, and 9 may be applied to a wafer level packaging process.

Wafer-Level Packaging (WLP) refers to the technology of packaging an integrated circuit at wafer level, instead of the traditional process of assembling the package of each individual unit after wafer dicing. WLP is closest to being a true chip-scale packaging (CSP) technology. Wafer-level packaging integrates wafer fabrication, packaging, test, and burn-in at wafer level, and streamlines the manufacturing process. Wafer-level packaging extends the wafer fabrication processes to include device interconnection and device protection processes. The use of WLP has dramatically grown as a result of its advantages in size, performance, flexibility, reliability, and cost over other packaging methods.

Figure 8A:
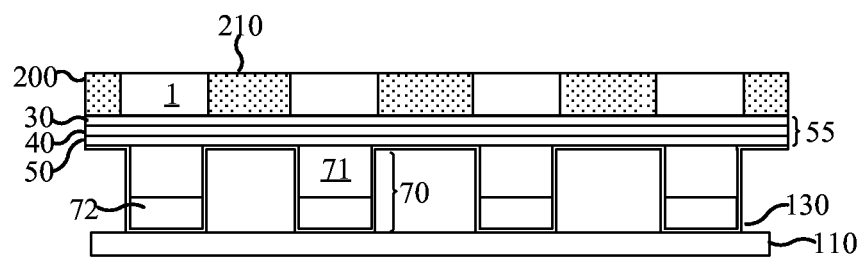
FIGS. 8A-8D, illustrates a wafer level package during various stages of fabrication in accordance with alternative embodiments of the present invention.

Referring to FIG. 8A, a reconstituted wafer 200 comprising a plurality of singulated chips 1 is illustrated. The chips 1 are embedded within an encapsulant 210, which may be a mold compound in one or more embodiments.

Fan-in WLP refers to standard wafer level packaging wherein the package area is about the same as the chip area. Hence, the packaging is limited by the number of input/output connections. In a fan-out WLP, the packaging includes additional space surrounding the chip area for forming additional input/output (I/O) connections. The additional space enables forming WLP bump pads for connecting to the circuitry of the chip.

In fan-out WLP, after completion of front end and back end processing, the wafer is diced to form individual chips. These diced chips are arranged on an adhesive tape, which is disposed on a carrier, while maintaining a predetermined separation between the chips. This predetermined separation is larger than the separation between the chips on the wafer. Typically, but not necessarily, the glued chips on the adhesive tape are arranged in a circular manner emulating the shape of a wafer. An encapsulant material such as mold compound or epoxy compound is poured to fill in the gaps between the chips. The encapsulant material is cured, for example, by annealing to form a reconfigured wafer or a reconstituted wafer 200 comprising the cured encapsulant material (encapsulant 210) and the individual chips 1. The reconfigured wafer 200 is separated from the adhesive tape and subsequent processing follows. Some of these subsequent processing is described herein below.

Figure 8B:
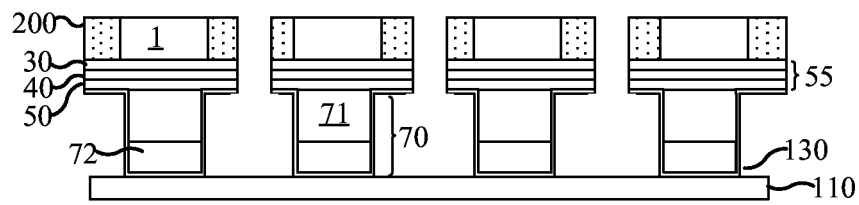

As illustrated in FIG. 8B, the embodiments of the present invention may be applied to form the contact layer 55, the solder layer 70, and the subsequent singulation of the reconfigured wafer 200.

Figure 8C:
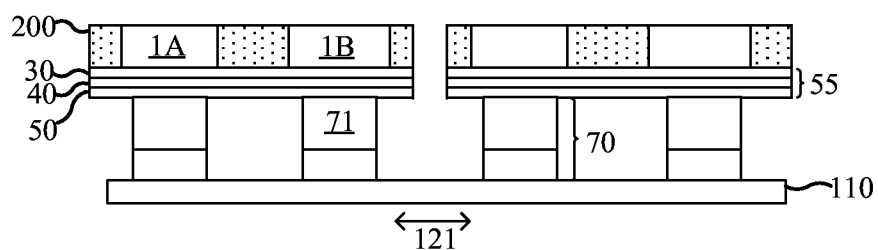
Figure 8D:
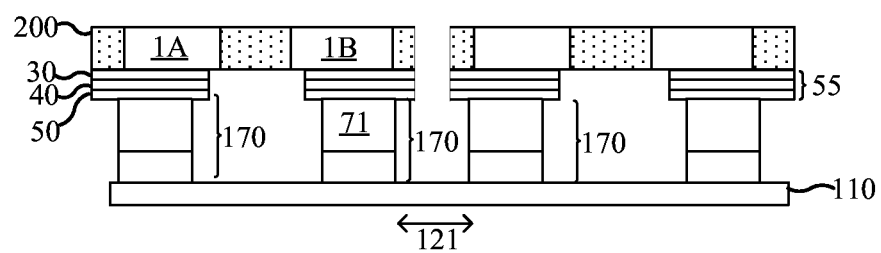

FIG. 8C illustrates an alternative embodiment highlighting the possibility of having more than one chip, for example, a first chip 1A and a second chip 1B in each semiconductor device after the singulation process. Referring to FIG. 8D, the solder pad 170 coupled to the first chip 1A is isolated from the solder pad 170 coupled to the second chip 1B, for example, using a process as described using FIG. 7.

Figure 9A:
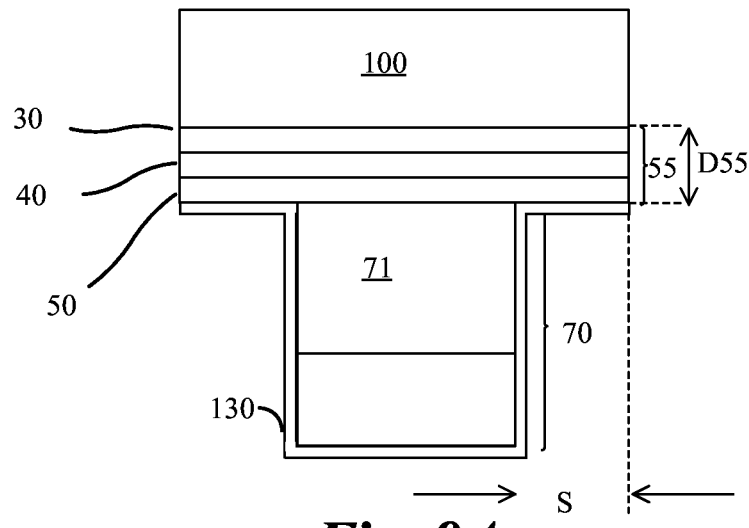
FIGS. 9A and 9B, illustrates alternative structural embodiments of the semiconductor device.
Figure 9B:
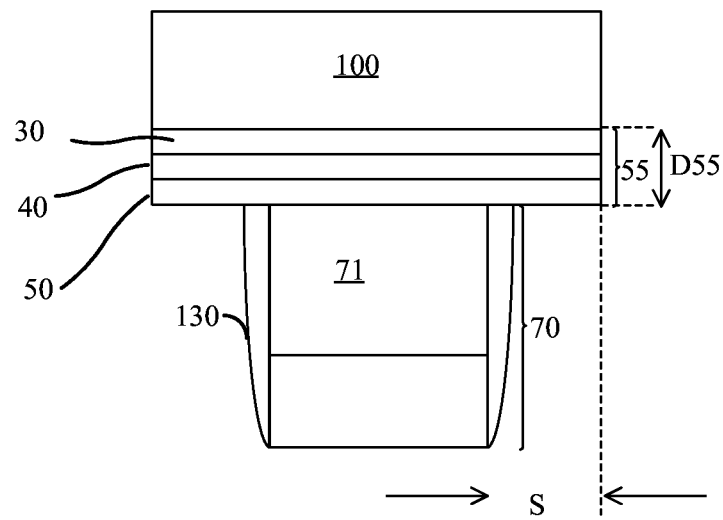

FIG. 9, which includes FIGS. 9A and 9B, illustrates alternative structural embodiments of the semiconductor device.

Unlike the prior embodiment illustrated in FIG. 1, in this embodiment, the solder layer 70 is covered by an additional protective layer 130. In various embodiments, the additional protective layer 130 may be applied as a conformal liner (FIG. 9A) or as a spacer (FIG. 9B). In various embodiments, the additional protective layer 130 may be added for electrical and/or mechanical reasons.

In various embodiments, advantageously, the solder layer 70 formed using embodiments of the present invention results in an excellent structure. For example, the sidewalls of the solder pads 170 (e.g., FIG. 1) is smooth, straight, with no molten area, no cracks, or no torn out materials.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, or a copper intermetallic.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-10 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

What is claimed is:

1. A method of forming a semiconductor device, the method comprising:
    forming a metallization layer over a first major surface of a substrate;
    forming a contact layer over a second major surface of the substrate, the second major surface being opposite to the first major surface, the substrate comprising device regions separated by kerf regions, the contact layer overlapping with the kerf regions and the device regions, wherein the contact layer substantially covers an entire second major surface;
    at the second major surface, forming a structured solder layer over the device regions, wherein a portion of the contact layer is exposed at the kerf regions after forming the structured solder layer, wherein the structured solder layer overlaps with at least 80% of the contact layer, and wherein the structured solder layer is thicker than the substrate;
    after forming the structured solder layer, forming a conformal liner over the structured solder layer and the exposed contact layer at the kerf regions, the conformal liner covering sidewalls of the structured solder layer, the conformal liner being formed in a conformal way as a liner over the structured solder layer; and
    dicing through the conformal liner, the contact layer, and the substrate in the kerf regions.

2. The method of claim 1, wherein the substrate is a semiconductor wafer.

3. The method of claim 1, wherein the substrate is a reconfigured wafer comprising a plurality of dies disposed in an encapsulant.

4. The method of claim 1, wherein the dicing is performed from the first major surface.

5. The method of claim 1, wherein the dicing is performed from the first major surface using a dry laser process or a stealth laser process.

6. The method of claim 1, wherein the dicing is performed from the first major surface using a mechanical dicing process.

7. The method of claim 1, wherein the dicing is performed from the second major surface using a plasma dicing process.

8. The method of claim 7, wherein the dicing further comprises using a wet chemical etching process to remove the contact layer disposed in the kerf regions prior to the plasma dicing process.

9. The method of claim 1, wherein forming the structured solder layer comprises using a plating process or a printing process.

10. The method of claim 1, wherein forming the structured solder layer comprises depositing a layer comprising a metal selected from the group consisting of copper, tin, indium, and gold, silver, and combinations thereof.

11. The method of claim 1, wherein forming the contact layer comprises depositing a layer comprising a metal selected from the group consisting of aluminum, titanium, copper, nickel, vanadium, chromium, gold, and combinations thereof.

12. A method of forming a semiconductor device, the method comprising:
    forming a metallization layer over a first major surface of a substrate;
    forming a contact layer over a second major surface of the substrate, the second major surface being opposite to the first major surface, wherein the contact layer substantially covers an entire second major surface;
    at the second major surface, forming a structured solder layer over the contact layer, wherein the structured solder layer overlaps with at least 80% of the contact layer, and wherein the structured solder layer is thicker than the substrate;
    after forming the structured solder layer, forming a spacer around the structured solder layer, the spacer covering sidewalls of the structured solder layer; and
    after forming the spacer around the structured solder layer, singulating the substrate by dicing through the contact layer and the substrate and not the structured solder layer.

13. The method of claim 12, wherein the substrate is a semiconductor wafer.

14. The method of claim 12, wherein the substrate is a reconfigured wafer comprising a plurality of dies disposed in an encapsulant.

15. The method of claim 12, wherein the dicing is performed from the first major surface.

16. The method of claim 12, wherein the dicing is performed from the major surface using a dry laser process or a stealth laser process.

17. The method of claim 12, wherein the dicing is performed from the major surface using a mechanical dicing process.

18. The method of claim 12, wherein the dicing is performed from the second major surface using a plasma dicing process.

19. The method of claim 12, wherein forming the structured solder layer comprises using a plating process or a printing process.

20. A method of forming a semiconductor device, the method comprising:
    forming a metallization layer over a first major surface of a substrate;
    forming a contact layer over a second major surface of the substrate, the second major surface being opposite to the first major surface, wherein the contact layer substantially covers an entire second major surface;
    at the second major surface, forming a solder pad over the contact layer, wherein the solder pad overlaps with a central portion of the contact layer, and wherein a remaining peripheral portion of the contact layer comprising a surface parallel to the second major surface of the substrate and being part of an exposed surface of the semiconductor device, wherein the solder pad overlaps with at least 80% of the contact layer, and wherein the solder pad is thicker than the substrate; and after forming the solder pad, forming a protective layer around the solder pad, the protective layer covering sidewalls of the solder pad, wherein the protective layer is formed in a conformal way as a liner.

21. The method of claim 20, wherein the solder pad is thicker than the contact layer.

22. The method of claim 20, wherein the solder pad is a back side contact for the semiconductor device, wherein the semiconductor device comprises contacts at a front surface opposite the second major surface.

23. The method of claim 20, wherein the substrate is a semiconductor material.

24. The method of claim 20, further comprising:
forming a further solder pad over the contact layer.

25. The method of claim 24, wherein the further solder pad is not electrically coupled to the solder pad through the contact layer.

\* \* \* \* \*